United States Patent [19]
Acosta et al.

[11] Patent Number: 5,600,499
[45] Date of Patent: Feb. 4, 1997

[54] TRI-BIT ENCODING FOR DISK DRIVE SERVO TRACK ID INFORMATION

[75] Inventors: Marc E. Acosta, San Clemente; Richard W. Hull, Laguna Hills; Michael Spaur, Laguna Niguel, all of Calif.

[73] Assignee: Western Digital Corporation, Irvine, Calif.

[21] Appl. No.: 45,583

[22] Filed: Apr. 9, 1993

[51] Int. Cl.$^6$ ............................... G11B 5/09; G11B 5/596
[52] U.S. Cl. ................... 360/40; 360/48; 360/49; 360/77.80
[58] Field of Search .................. 360/40, 48, 49, 360/77.07, 77.08, 78.14

[56] References Cited

U.S. PATENT DOCUMENTS

| | | | |
|---|---|---|---|
| 4,553,131 | 11/1985 | Endoh | 360/40 |
| 4,912,467 | 3/1990 | Whitfield et al. | 360/44 |
| 5,170,299 | 12/1992 | Moon | 360/78.14 |

OTHER PUBLICATIONS

"Modulation and Coding for Information Storage" Siegel et al., Dec. 1991, pp. 68–86, IEEE Communications Magazine.

*Primary Examiner*—W. C. Kim
*Attorney, Agent, or Firm*—Leo J. Young, Esq.; James A. Ward, Esq.

[57] ABSTRACT

A format for embedded servo track identification fields in rotating disk data storage units such as magnetic disk drives. The present invention uses the concept of tri-bits (i.e., three code bits per logical bit) to encode track identification information in servo wedges of embedded servo disk drive systems. More specifically, two particular sets (and their equivalents) of tri-bit codes have been discovered to have optimum characteristics for providing a phase coherent encoding of a Gray code that is simple to translate into straight binary code. The properties of such tri-bit encoding limit error propagation to a single bit, which allows for very reliable track identification during movement of a head transducer across tracks (i.e., "seeks"). A full range of Gray scale codes is available since more than two consecutive logical "0"s can be reliably decoded when encoded using such tri-bits. The properties of such tri-bit encoding also allow for relatively high servo channel rates, which results in a reduction in servo field length. Accordingly, a counter-intuitive result of increasing the length of the encoding symbols for track identification fields is to decrease the overall length of the servo field, thereby permitting an increase in areal density.

9 Claims, 7 Drawing Sheets

Track ID 12 tribits, 3T's each
(example: 101010101010)

US 5,600,499

TRI-BIT ENCODING FOR DISK DRIVE SERVO TRACK ID INFORMATION

BACKGROUND OF THE INVENTION

1. Field of the Invention

This invention relates to computer peripheral data storage devices, and in particular to a format for embedded servo track identification fields in rotating disk data storage units such as magnetic disk drives.

2. Description of Related Art

Rotating disk data storage units ("disk drives") are commonly used to store data in computer systems. Conventionally, each disk drive comprises one or more rotating disks coated with or made from magnetic or optical recording material. Generally, each disk surface is formatted into a plurality of tracks, each track comprising a plurality of physical sectors. Movable read-write transducer heads positioned proximate to each disk surface are used to record the track and sector formats, and to read data from and write data to each physical sector.

Extensive research efforts in the field of magnetic hard disk drives for many years have been directed to developing practical techniques for increasing areal recording density and improving the reliability of such drives. Improved techniques for increasing areal recording density have been an important enabling factor in the trend in this field toward smaller, yet higher capacity, disk drives.

Areal recording density is generally expressed in terms of bits per square inch (or other unit area). Analytically, areal density is a product of the track density (i.e., the number of concentric tracks per inch, or "TPI") on the surface of a disk, and the bit density (i.e., the number of bits per inch, or "BPI") that can be recorded along a particular track.

The heads of modern disk drives are generally positioned by means of a closed-loop servo system. With a small number of stacked media disks, a common design is to write servo information in "servo wedges" embedded around the surface of each disk. Such embedded servo designs may have, for example, 10 to 100 servo wedges per disk surface, dividing the tracks of each surface into a number of sectors of a circle which may be referred to as "data wedges". FIG. 1 is a top view of a prior art embedded servo disk surface showing eight servo wedges 2, eight data wedges 4, an inner track 6, and an outer track 8. However, in modern embedded servo disk drives, the number of data wedges on a track normally would be significantly higher.

In embedded servo drives, it is necessary to read track identification information while a transducer head is moving radially across the media, as well as when the transducer head is centered over a particular track. Accordingly, each servo wedge 2 contains a track identification (ID) field, TKID, to provide such track identification information. The TKID value remains constant for each servo wedge 2 of a particular track.

One requirement for encoding identification information is that the code must be readable while the transducer head is moving radially across the disk media, and possibly spanning two tracks, as shown in FIG. 2. In FIG. 2, a transducer head 10 is traversing two adjacent tracks 11a, 11b. Since the disk surface is rotating, the path of the transducer head 10 will diagonally cut across fields on adjacent tracks 11a, 11b. Hence, it is possible that the transducer head 10 may read a first part of the TKID field 12a of one track 11a and then a second part of the TKID field 12b of the second track 11b. Accordingly, the TKID fields 12a, 12b must be unambiguously encoded in order to positively determine the radial location of the transducer head 10.

The prior art has attempted to meet these criteria by providing a binary track identification number mapped to a Gray code and encoded using di-bits (i.e., two code bits per logical bit) written in the TKID field of each servo wedge 2. As is known, a Gray code is a modified binary code in which sequential numbers are represented by expressions that differ only in one logical bit, to minimize errors. For example, the binary sequence for decimal numbers 0 through 3 and one Gray code equivalent mapping is set forth below:

| Decimal | Binary | Gray Code |
|---------|--------|-----------|
| 0 | 00 | 00 |
| 1 | 01 | 01 |
| 2 | 10 | 11 |
| 3 | 11 | 10 |

Note that only one bit position changes in the Gray code for pairs of adjacent numbers in the sequence.

In order to permit reliable reading of a TKID field across track boundaries, the encoded data must also maintain phase coherency across track boundaries. Phase coherency means that adjacent code bits on adjacent tracks must start with the same polarity of flux reversal.

Di-bits have been chosen in the past because they meet the above criteria, and have been deemed to provide a compact encoding of the necessary track ID information. The di-bit values used in the past for encoding track ID information have been as shown in FIG. 3, in which a logical "1" is encoded as two code symbols or bits comprising a negative pulse followed by a positive pulse (or vice versa), whereas a logical "0" has been encoded by two code symbols or bits comprising the lack of pulses (i.e., only a time duration defines a "0").

A significant problem in using di-bits to encode track ID information is that long runs of logical "0"s cannot be decoded reliably. A long run of logical "0"s would be encoded as no signal, which causes a problem in decoding exactly how many logical "0" bits have been encoded. Indeed, no di-bit encoded Gray code having more than two sequential logical "0"s has been used because of decoding problems. Therefore, such Gray code values have not been used for mapping track identification numbers. Unfortunately, skipping Gray code mappings of a binary sequence requires a complex mapping circuit to decode the usable Gray codes back into a simple binary code. In practice, a relatively slow lookup table ROM circuit has been used to perform such a mapping.

Moreover, the conventional prior art di-bit encoded Gray code can be characterized as a 0,4,1,2 code. Such a code allows a minimum space of zero code bits without a flux reversal (pulse), a maximum space of four code bits without a pulse, and uses two code bits to encode one logical bit. This means that such a di-bit encoded Gray code has a minimum frequency of ⅕ of the maximum frequency. This large ratio causes known problems in signal processing and data synchronization in the read channel of a disk drive.

Conventional teaching is that di-bits are a space efficient code. However, due to the above-mentioned read channel signal processing and data synchronization problems, the linear bit density of di-bits is relatively low.

Accordingly, there is a need to provide a means of encoding track ID information in an embedded servo disk drive system that permits encoding relatively long run lengths of logical "0"s, and yet meets all of the other limitations imposed upon such codes. That is, such an encoding means must be very reliable, must be phase coherent, should consume little area on the media, and should be relatively inexpensive to detect and decode.

The present invention provides such a means.

SUMMARY OF THE INVENTION

The present invention uses the concept of tri-bits (i.e., three code bits per logical bit) to encode track identification information in servo wedges of embedded servo disk drive systems. More specifically, two particular sets (and their equivalents) of tri-bit codes have been discovered to have optimum characteristics for providing a phase coherent encoding of a Gray code that is simple to translate into straight binary code.

In the preferred embodiment of the present invention, a first logical value (e.g., "1") is encoded as a tri-bit value of "111", where each tri-bit "1" signifies a flux transition or data pulse, and a second logical value (e.g., "0"), is encoded as a tri-bit value of "100". Functional equivalents to this pair of codes are the tri-bit pairs ("111", "001") and ("111", "010").

In an alternative embodiment of the present invention, the tri-bit values of "110" and "101" are used to encode logical values. A functional equivalent to this pair of codes are the tri-bit pair ("011", "101").

The properties of such tri-bit encoding limit error propagation to a single bit, which allows for very reliable track identification during movement of a head transducer across tracks (i.e., "seeks"). A full range of Gray scale codes is available since more than two consecutive logical "0"s can be reliably decoded when encoded using such tri-bits. The properties of such tri-bit encoding also allow for relatively high servo channel rates, which results in a reduction in servo field length. Accordingly, a counter-intuitive result of increasing the length of the encoding symbols for track identification fields is to decrease the overall length of the servo field, thereby permitting an increase in areal density.

The details of the preferred embodiment of the present invention are set forth in the accompanying drawings and the description below. Once the details of the invention are known, numerous additional innovations and changes will become obvious to one skilled in the art.

BRIEF DESCRIPTION OF THE DRAWINGS

Like reference numbers and designations in the various drawings refer to like elements.

DETAILED DESCRIPTION OF THE INVENTION

Figure 1:
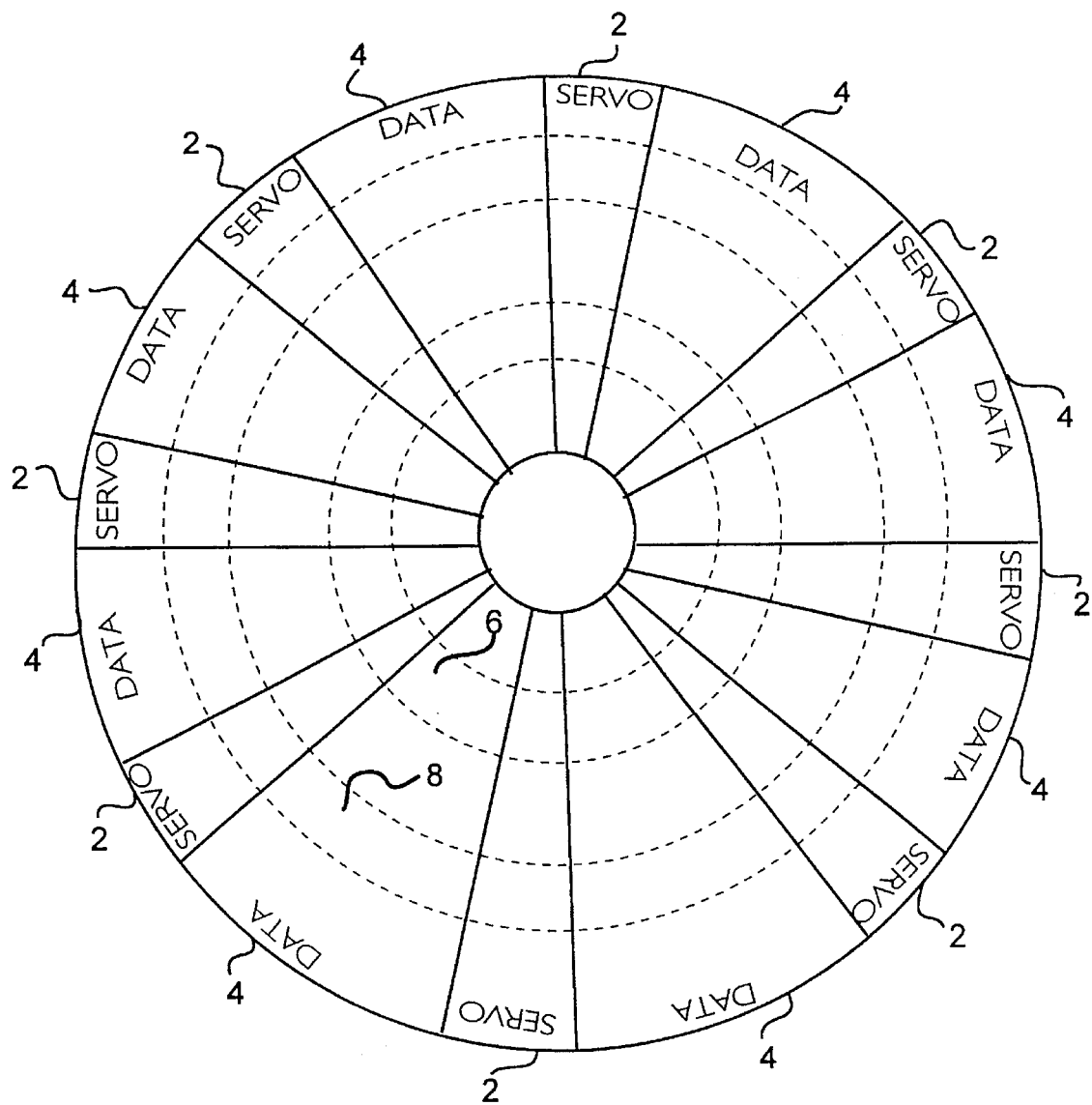
FIG. 1 is a diagram of a prior art disk surface showing tracks, servo-wedges, and data wedges.
Figure 2:
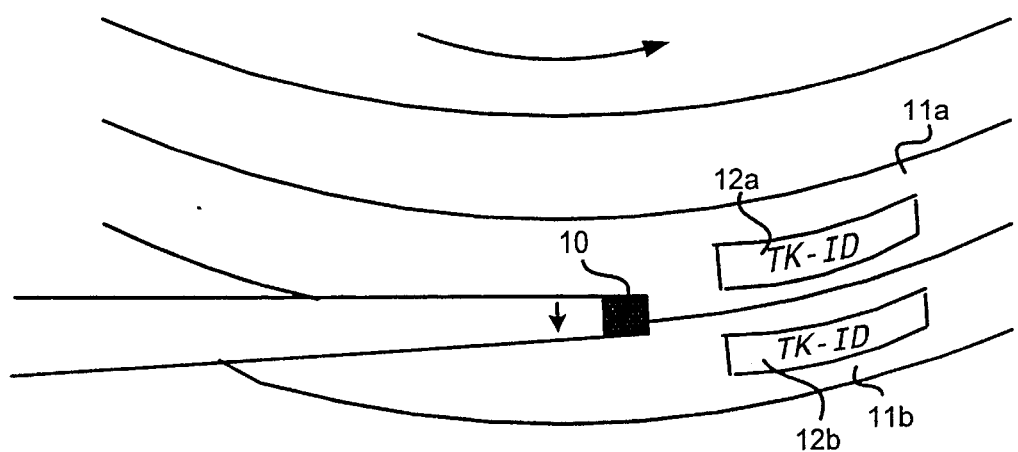
FIG. 2 is a diagram of a prior art disk surface showing a transducer head seeking across tracks.
Figure 3:
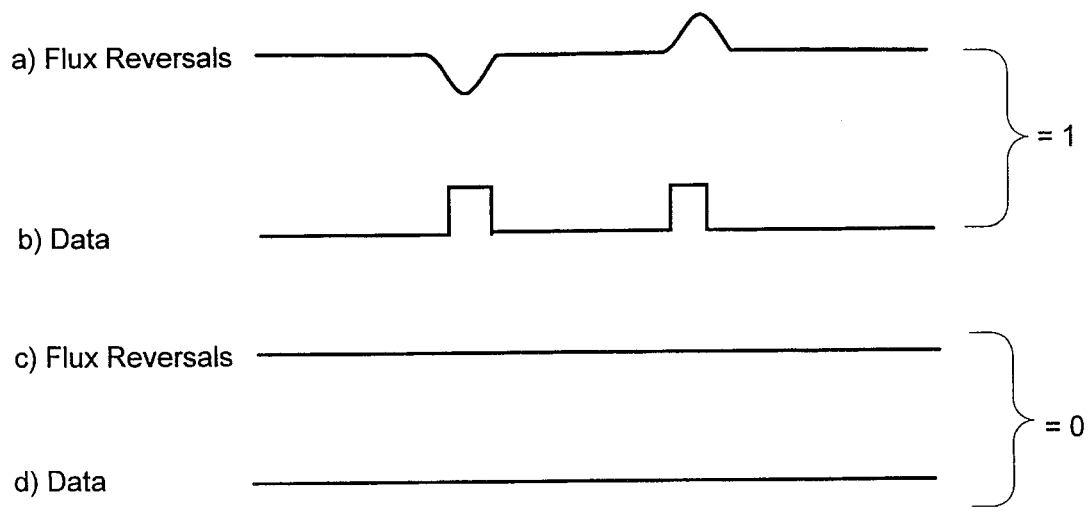
FIG. 3 is a diagram of a prior art di-bit waveform and data pattern.
Figure 4:
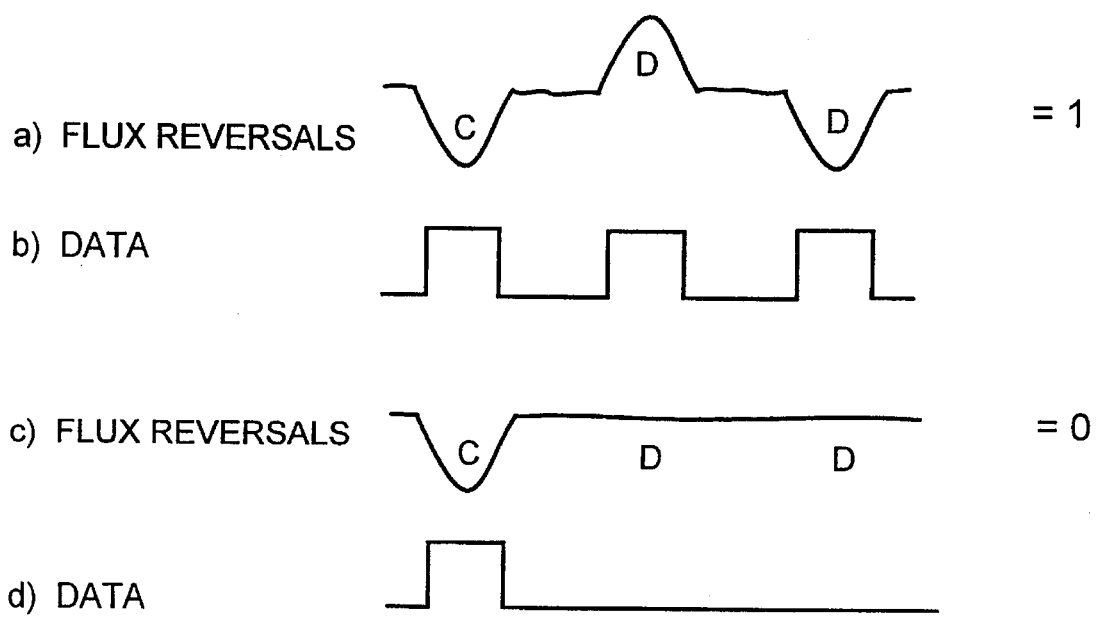
FIG. 4 is a diagram of a pair of tri-bit waveforms and data patterns in accordance with the preferred embodiment of the; present invention.

Throughout this description, the preferred embodiment and examples shown should be considered as exemplars, rather than as limitations on the present invention.
Preferred Tri-Bit Encoding FIG. 4 is a diagram of a pair of tri-bit waveforms and data patterns in accordance with the preferred embodiment of the present invention. The tri-bit values "111" and "100" represent logical "1" and "0", respectively. (It should be noted that the tri-bit values can be switched if desired, so that the tri-bit values "111" and "100" represent logical "0" and "1", respectively; further, the polarity of the flux reversals can be reversed from the polarity shown).

A Gray code encoded with such tri-bits can be characterized as a 0,2,1,3 code. Such a code allows a minimum space of zero code bits without a flux reversal (pulse), a maximum space of two code bits without a pulse, and uses three code bits to encode one logical bit. This means that a Gray code encoded using these tri-bits has a minimum frequency of ⅓ of the maximum frequency. However, significantly, by selecting certain pairs of such tri-bits, other characteristics occur that are useful in the context of disk drives.

The selected tri-bits, "111" and "100", have the desirable characteristics of being phase coherent and self-clocking. That is, the logical "0" valued tri-bit includes a "clock" pulse C that always indicates that a symbol is present. The remaining two pulse positions D can be thought of as encoding data. It should be noted that consecutively recorded tri-bits of the preferred patterns, when read back in the same order, will have clock pulses C of opposite flux reversal polarity.

Because of the self-clocking characteristics of the selected tri-bit patterns, the linear bit density of tri-bits is relatively high. That is, tri-bit encoding allows for relatively high servo channel rates, which results in a reduction in servo field length. Accordingly, a counter-intuitive result of increasing the length of the encoding symbols for track identification fields is to decrease the overall length of the servo field, thereby permitting an increase in areal density.

Functional equivalents to the ("111", "100") pair of codes are the tri-bit pairs ("111", "001") and ("111", "010"). That is, these equivalent tri-bit patterns have all of the same properties as the tri-bit patterns shown in FIG. 4.

The pair of tri-bit codes shown in FIG. 4, and their functional equivalents, are preferred when the read channel of the disk drive has a hysteresis pulse detector (i.e., the detector must detect a positive pulse before it can detect a negative pulse, or vice versa). Otherwise, during track seeks, the transducer head can move across adjacent track ID fields and be unable to reliably detect the Gray code tri-bit in transition at the track boundary, thus causing a decoding error. Unless an opposite polarity flux reversal occurs at the next clock pulse C, that decoding error can propagate. The preferred tri-bit patterns also minimize the risk of media defects causing bit error decoding propagation during track following.

Figure 6:
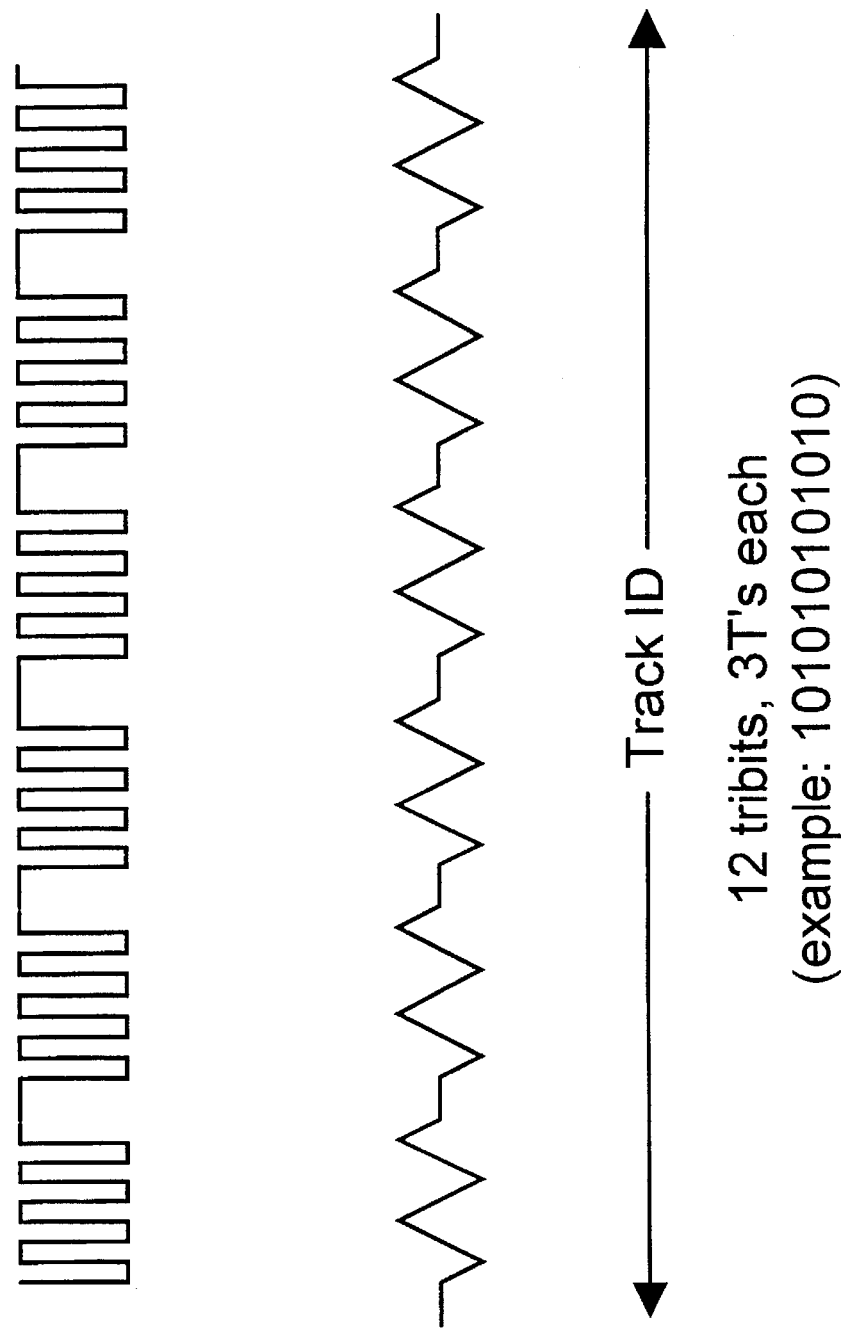
FIG. 6 is a waveform of an example track ID in accordance with the preferred embodiment of the present invention.

FIG. 6 is a waveform of an example track ID in accordance with the preferred embodiment of the present invention. The track ID comprises a 12 logical bit Gray code number encoded as 12 tri-bits using the waveforms shown in FIG. 4 for each logical "1" and logical "0". In the example shown in FIG. 6, the encoded Gray code is a logical "101010101010". Of course, other track ID lengths can be used.

Alternative Tri-Bit Encodings

Figure 5:
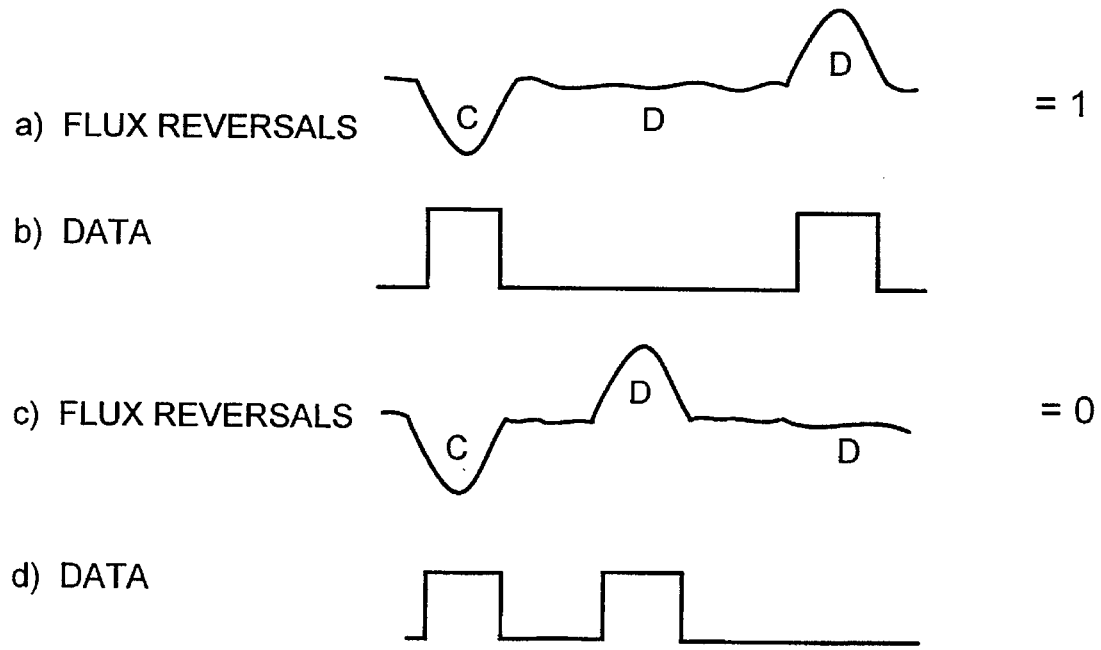
FIG. 5 is a diagram of a pair of tri-bit waveforms and data patterns in accordance with an alternative embodiment of the present invention.

FIG. 5 is a diagram of a pair of tri-bit waveforms and data patterns in accordance with an alternative embodiment of the present invention. The tri-bit values "110" and "101" represent logical "1" and "0", respectively. (It should be noted that the tri-bit values can be switched if desired, so that the tri-bit values "110" and "101" represent logical "0" and "1", respectively; further, the polarity of the pulses can be reversed from the polarity shown).

A Gray code encoded with such tri-bits can be characterized as a 0,1,1,3 code. Such a code allows a minimum space of zero code bits without a pulse, a maximum space of one code bit without a pulse, and uses three code bits to encode one logical bit. This means that a Gray code encoded using these tri-bit patterns has a minimum frequency of ½ of the maximum frequency. Accordingly, it may be desirable to use these tri-bit patterns when using a non-hysteresis pulse detector, because the smaller minimum to maximum frequency ratio makes signal processing and data synchronization more reliable.

A functional equivalent to the ("110", "101") pair of codes is the tri-bit pair ("011", "101"). That is, these equivalent tri-bit patterns have all of the same properties as the tri-bit patterns shown in FIG. 5.

Gray-Code Encoding & Decoding

One of the advantages of using the tri-bit encoding described above is that the decoder logic and implementation of that logic are extremely simple. Binary track ID numbers are directly encoded as a standard Gray code field; no other mapping is required. Set forth below is a table showing the logic equations for encoding a 12 logical bit track ID number into a particular Gray code (other Gray code mappings may be used):

| | |
|---|---|
| Gray code bit 11 = | TKID bit 11 |
| Gray code bit 10 = | TKID bit 10 ⊗ TKID bit 11 |
| Gray code bit 9 = | TKID bit 9 ⊗ TKID bit 10 |
| Gray code bit 8 = | TKID bit 8 ⊗ TKID bit 9 |
| Gray code bit 7 = | TKID bit 7 ⊗ TKID bit 8 |
| Gray code bit 6 = | TKID bit 6 ⊗ TKID bit 7 |
| Gray code bit 5 = | TKID bit 5 ⊗ TKID bit 6 |
| Gray code bit 4 = | TKID bit 4 ⊗ TKID bit 5 |
| Gray code bit 3 = | TKID bit 3 ⊗ TKID bit 4 |
| Gray code bit 2 = | TKID bit 2 ⊗ TKID bit 3 |
| Gray code bit 1 = | TKID bit 1 ⊗ TKID bit 2 |
| Gray code bit 0 = | TKID bit 0 ⊗ TKID bit 1 |

Note that the least significant to most significant bit order could be reversed to give yet another Gray code.

Since the TKID fields need only be written to the servo wedges 2 once, the Gray codes can be computed in software and written to the disk tracks during servo formatting by the manufacturer.

Set forth below is a table showing the logic equations for decoding a 12-bit Gray code of a track ID number into a conventional binary number:

| | |
|---|---|
| TKID bit 11 = | Gray code bit 11 |
| TKID bit 10 = | Gray code bit 10 ⊗ TKID bit 11 |
| TKID bit 9 = | Gray code bit 9 ⊗ TKID bit 10 |
| TKID bit 8 = | Gray code bit 8 ⊗ TKID bit 9 |
| TKID bit 7 = | Gray code bit 7 ⊗ TKID bit 8 |
| TKID bit 6 = | Gray code bit 6 ⊗ TKID bit 7 |
| TKID bit 5 = | Gray code bit 5 ⊗ TKID bit 6 |
| TKID bit 4 = | Gray code bit 4 ⊗ TKID bit 5 |
| TKID bit 3 = | Gray code bit 3 ⊗ TKID bit 4 |
| TKID bit 2 = | Gray code bit 2 ⊗ TKID bit 3 |
| TKID bit 1 = | Gray code bit 1 ⊗ TKID bit 2 |
| TKID bit 0 = | Gray code bit 0 ⊗ TKID bit 1 |

As examples, using the above decoding scheme, a Gray code bit pattern of 555 hex would decode to a track ID of 666 hex, and a Gray code bit pattern of 7FF hex would decode to a track ID of 555 hex.

Figure 7:
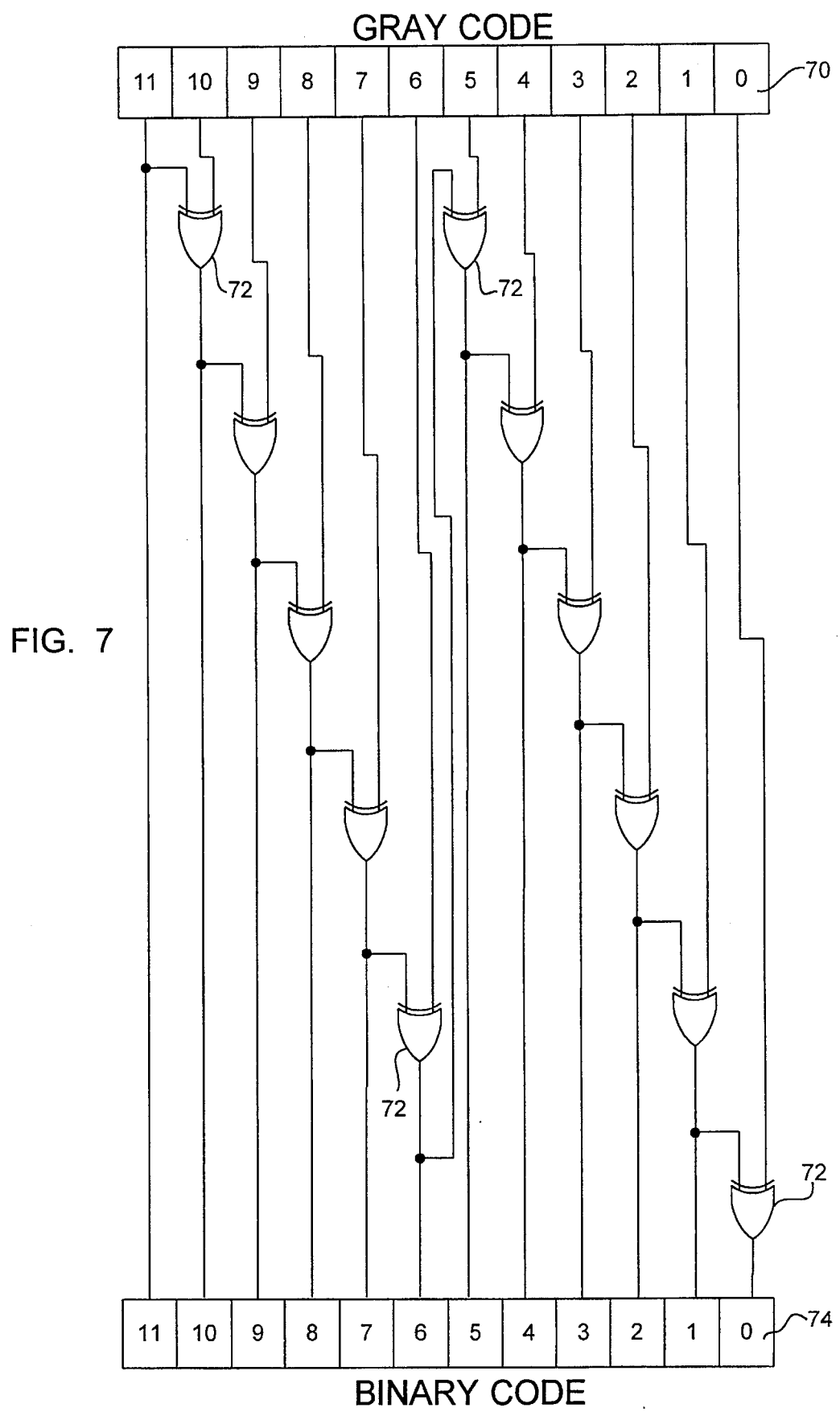
FIG. 7 is a block diagram of a preferred embodiment of a Gray code-to-binary decoder for use in conjunction with the present invention.

Since the track ID's must be read in real-time during disk operation, decoding of the TKID fields is preferably done by means of a dedicated circuit. FIG. 7 is a block diagram of a preferred embodiment of a Gray code-to-binary decoder for use in conjunction with the present invention. The Gray code to be decoded may be stored, for example, in a register 70. The outputs of the register 70 are coupled as shown through an array of two-input XOR gates 72. The outputs of the array of XOR gates 72 are coupled to an output register 74 which contains the decoded conventional binary code of the input Gray code.

Application of the Invention

Figure 8:
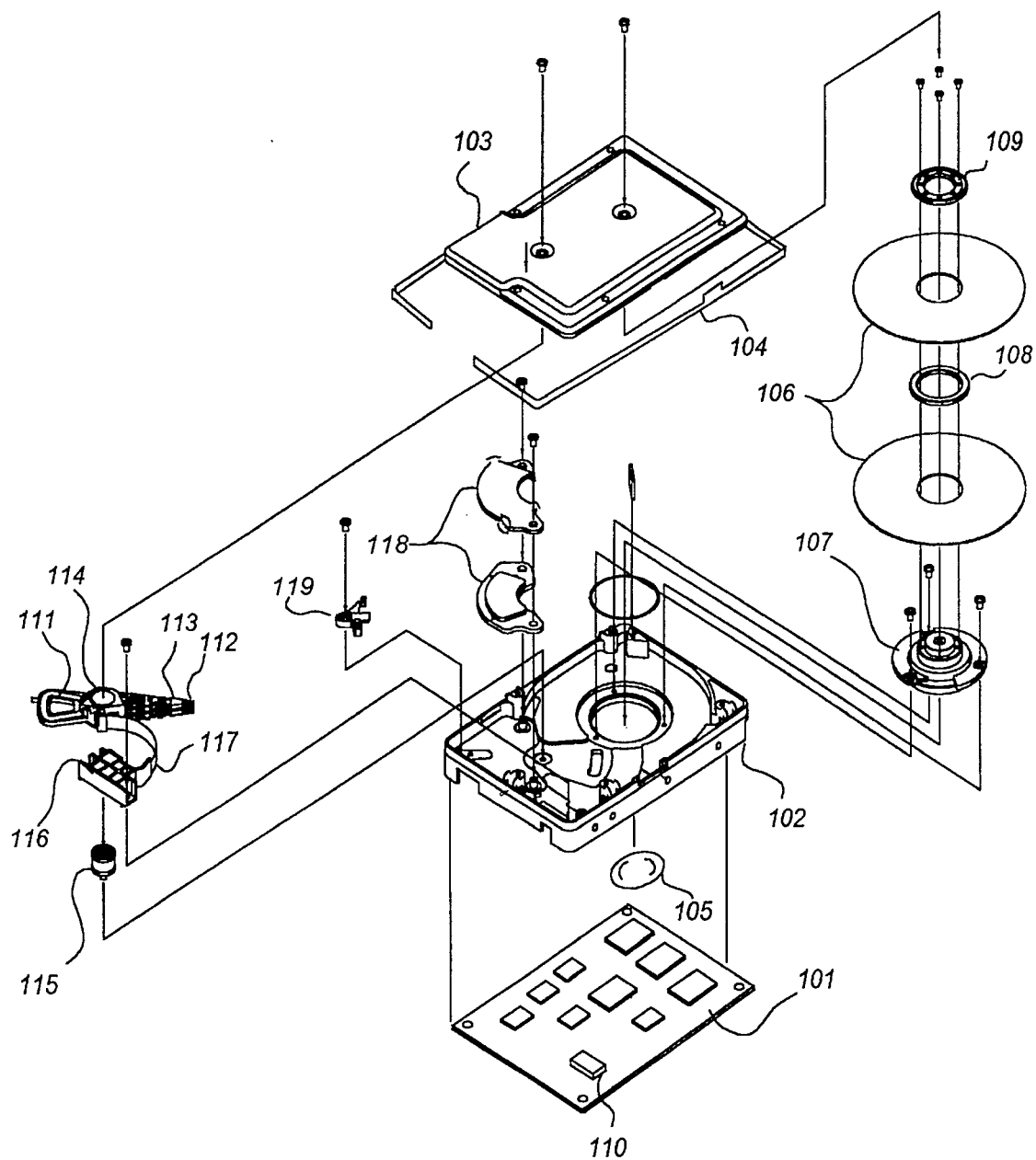
FIG. 8 is an exploded perspective view of a disk drive incorporating the present invention.

The present invention may be suitably adapted for use in conjunction with a disk drive of the type shown in exploded view in FIG. 8. A printed circuit board assembly ("PCBA") 101 includes numerous electronic components described in detail below with reference to FIG. 9. The PCBA 101 is attached to a base 102 by screws or similar means. A cover 103 attaches to the base 102 by screws or similar means. The base 102 and cover 103 and a conventional tape seal 104 are configure to form an essentially sealed enclosure. However, as known in the art, a "breather" membrane filter 105 may be provided for pressure equalization. One or more magnetic data storage disks 106 are provided, separated by a spacer 108, each having upper and lower recording surfaces. In the illustrated embodiment, the dimensions of the assembled enclosure and PCBA 101 are approximately 0.50 inches high by 2.75 inches long by 1.8 inches wide. The present invention may be embodied in disk drives having a different number of disks and other form factors.

A spindle motor 107 is mounted to the base 102. A disk clamp 108 assembly 109 is provided for mounting the disk 106 to the spindle motor 107. Preferably, the spindle motor 107 is a commercially available brushless three-phase motor. In operation, the spindle motor 107 rotates the disks 106 at a substantially constant angular velocity, typically in the range of 3000 to 6300 RPM.

An electrical connector 110 is provided on the PCBA 101. Some of the electronic components on the PCBA 101 are electrically connected by the connector 110 to electronic components within the sealed enclosure formed by the base 102 and the cover 103.

A voice-coil assembly 111 is provided, and typically includes two read/write transducer heads 112 per disk 106. In operation, each head 112 provides for writing data to, and reading data from, a disk 106. The voice-coil assembly 111 includes an actuator assembly that supports the heads 112 as they fly in conventional manner proximate to the disks 106, and moves the heads 112 into desired position for writing and reading operations on the disk 106. The actuator assembly includes load beams 113 and an "E-block" 114. At one end, each load beam 113 supports a head 112, and at the opposite end, each load beam 113 is supported by the E-block 114. A pivot bearing 115 defines an axis of rotation for the voice-coil assembly 111.

The voice-coil assembly 111 further includes a flex circuit assembly 116. The flex circuit assembly 116 includes an integrated multiplexer circuit (not shown) for controlling the writing of data to, and the reading of data from, the surfaces of the disks 106. The multiplexer circuit is suitably implemented by a commercially available integrated circuit manufactured and sold by Silicon Systems Inc. of Tustin, Calif. as part no. SSI 2020. The multiplexer circuit provides a write current to the particular head 112 selected for writing, and also contains a read preamplifier for the particular head 112 selected for reading. A mode select signal from the PCBA 101 determines whether the multiplexer circuit is to operate in a read or write mode.

The flex circuit assembly 116 also includes a flex cable 117 comprising conductive leads encased in a flexible plastic carrier. The flex cable 117 forms part of the electrical conduction path between the heads 112 and certain read/write control electronic circuits on the PCBA 101.

A magnet assembly actuator 118 and a latch assembly 119 are provided to cooperate with the voice-coil assembly 111 to form a voice-coil motor.

The masses of the voice-coil assembly 111, including the heads 112 and the E-block 114, are preferably disposed about the axis of rotation of the pivot bearing 115 such that the center of rotation of the pivot bearing 115 is also the center of mass of the voice-coil assembly 111. The voice-coil assembly 111 is freely rotatable through an arcuate range corresponding to an arcuate movement of the transducer heads 112 across the usable surface of the magnetic data storage disks 106. Rotation of the voice-coil assembly 111 is implemented by applying appropriate electrical currents to the voice-coil assembly 111, in known fashion.

Electrical connection of the flex circuit assembly 116 to the PCBA 101 is made through a gasketed opening provided in the base 102 to the electrical connector 110 on the PCBA 101. Electrical contact is made when the connector 110 is inserted through the gasket opening as the PCBA 101 is mated to the housing during an assembly process.

Figure 9:
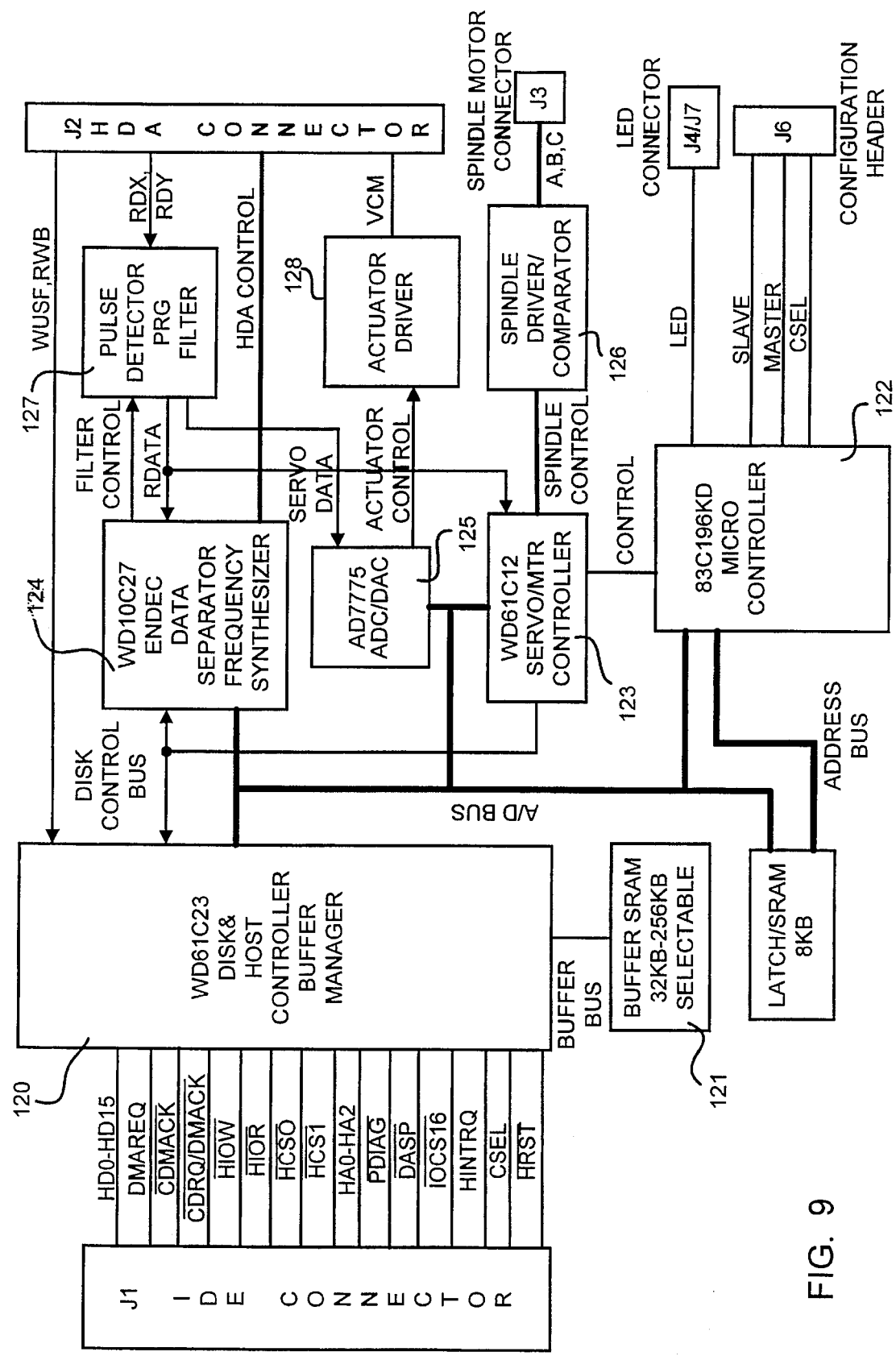
FIG. 9 is a block diagram of a storage unit control circuit for implementing the servo-independent format of the present invention and controlling a disk drive of the type shown in FIG. 8.

FIG. 9 is a block diagram of a storage unit control circuit (conventionally referred to as the drive electronics) for implementing the track ID format of the present invention and controlling a disk drive of the type shown in FIG. 8. The major electronic circuit components are preferably implemented as integrated circuits.

The drive electronics are disposed on a printed circuit board which is fixed to the disk drive housing, such as the PCBA 101 in FIG. 9. A connector J2 corresponds to the electrical connector 9 in FIG. 9. Electrical connection of the drive electronics to a host computer's host system bus (such as the AT bus commonly used in IBM-type personal computers) is made through a host system bus interface connector J1, in known fashion.

The drive electronics include a host interface disk controller (HIDC) 120 which directly connects to the host system bus via the interface connector J1. The HIDC 120 integrates conventional formatter/controller, CRC/ERC generator/checker, host interface, and buffer manager functions into a single integrated circuit containing two microcontrollers with associated ROM storage. The HIDC 120 may be a commercially available device such as the WD61 C23 HIDC from Western Digital Corp. of Irvine, Calif. A 32-KByte sector buffer 121 is connected to the HIDC 120 and enhances data throughput of the disk drive by buffering sector data between the disk drive and the host system bus.

A 16-bit microcontroller 122 controls and coordinates the activity of the voice-coil assembly 111 and the HIDC 120. The microcontroller 122 is suitably programmed to implement the Write and Read processes described above. The microcontroller 122 receives and sends command or status information over an internal multiplexed address/data (A/D) bus. Also connected to the A/D bus are a servo/motor controller 123, an ENDEC/data separator/frequency synthesizer 124, and an ADC/DAC circuit 125.

The servo controller 123 and ENDEC 124 are also connected to the HIDC 120 via a disk control bus. The servo controller 123 may be a commercially available device such as the WD61C12 Servo/Motor Controller from Western Digital Corp. of Irvine, Calif. Similarly, the ENDEC 124 may be a WD19C27 Separator/Frequency Synthesizer device from Western Digital Corp. of Irvine, Calif.

The servo controller 123 provides servo discrimination, track address capture, and spindle motor control. For spindle motor control, the servo controller 123 preferably operates in accordance with the teachings of co-pending U.S. patent application No. 07/951,378, entitled "Polyphase Brushless DC Motor Control," assigned to the assignee of the present invention. Such teachings are hereby incorporated by reference. The servo controller 123 is coupled through a spindle driver/comparator 126 to the disk drive through a spindle motor connector J3. The spindle driver/comparator 126 may be, for example, a Model 6232 from SGS Thompson.

The ENDEC 124 handles read/write signals between the HIDC 120 and the read channel circuitry, receiving read data from the read/write heads 112 via the multiplexer circuit described above with respect to FIG. 8 and a pulse detector/frequency filter 127, and providing write data to the heads 112 via the multiplexer circuit. More particularly, the ENDEC 124 performs the following functions: data synchronization, frequency synthesis, read channel filter control, encoding and decoding (ENDEC), and write precompensation. The pulse detector/frequency filter 127 converts analog read data received from the multiplexer circuit to a digital data stream (RDATA) which is provided to the ENDEC 124, in which data is separated from synchronization and location information in a conventional manner. The data is transferred to the HIDC 120, which temporarily stores the data in the sector buffer 1 21 until the host system is ready to receive it over the interface connector J1.

The ENDEC 124 may include circuitry operating in accordance with the teachings of co-pending U.S. patent application Ser. No. 07/695,531, entitled "Disk Drive Data Synchronizer with Window Shift Synthesis", filed May 3, 1991, and/or with the teachings of co-pending U.S. patent application Ser. No. 07/685,473, entitled "Data Synchronizer with Symmetric Window Generation", filed April 12, 1991, both assigned to the assignee of the present invention. Such teachings are hereby incorporated by reference.

When a selected read/write head 112 passes over a servo sample wedge 2, the RDATA is processed by the servo controller 123. The servo controller 123 provides data synchronization, servo address mark detection, and servo track address decoding, in substantially the same way as the ENDEC 124. The servo address mark is used to generate positional timing reference signals for the drive electronics. Such positional timing reference signals enable the ADC/DAC 125 to demodulate analog servo bursts from the servo sample wedges 2 in order to determine head position relative to the centerline of a selected track. The demodulated data is provided to the servo controller 123 and the microcontroller 122 via the internal A/D bus. Firmware within the microcontroller 122 determines the degree of head misalignment (if any) and commands the servo controller to move the head back in alignment with the track centerline. Head movement commands are directed to a DAC (digital-to-analog converter) contained within ADC/DAC 125, which converts digital command signals from the microprocessor 122 and servo controller 123 into analog signals. Analog head movement signals (VCMDAC) and a voltage reference signal (VREF) are sent to an actuator driver integrated circuit 128. The actuator driver 128 moves the voice-coil assembly 111 by providing VCM drive signals (VCMIN and VCMOUT). The actuator driver 128 may be a commercially available device such as the Model 3173 from Unitrode Corporation.

Using the drive electronics shown in FIG. 9, tri-bit patterns of the type shown in FIG. 4 or in FIG. 5 can be written to each TKID field of each track of a disk drive.

SUMMARY

The present invention uses the concept of tri-bits to encode track identification information in servo wedges of embedded servo disk drive systems. More specifically, two particular sets (and their equivalents) of tri-bit codes have been discovered to have optimum characteristics for providing a phase coherent encoding of a Gray code that is simple to translate into straight binary code. The properties of such tri-bit encoding limit error propagation to a single bit, which allows for very reliable track identification during movement of a head transducer across tracks. A full range of Gray scale codes is available since more than two consecutive logical "0"s can be reliably decoded when encoded using such tri-bits. The properties of such tri-bit encoding also allow for relatively high servo channel rates, which results in a reduction in servo field length.

A number of embodiments of the present invention have been described. Nevertheless, it will be understood that various modifications may be made without departing from the spirit and scope of the invention. Accordingly, it is to be understood that the invention is not to be limited by the specific illustrated embodiment, but only by the scope of the appended claims.

We claim:

1. In a hard disk drive, a method for encoding and writing track-identification data into a track-identification field in an embedded servo wedge comprising the steps of:

converting the binary track-identification data into a Gray code consisting of an array of binary "1" and "0" bits;

encoding the Gray code serially, one bit at a time, into a tri-bit code symbol;

writing the encoded tri-bit code symbols into the track-identification field as a series of flux reversals wherein each successive tri-bit symbol begins with a flux reversal which is of opposite polarity from the flux reversal beginning an immediately prior tri-bit symbol.

2. The method of claim 1 wherein Gray code "1" or "0" bits are encoded as 111,100 tri-bit symbols respectively.

3. The method of claim 1 wherein Gray code "1" and "0" bits are encoded as 111,001 tri-bit symbols respectively.

4. The method of claim 1 wherein Gray code "1" and "0" bits are encoded as 110,101 tri-bit symbols respectively.

5. The method of claim 1 wherein Gray code "1" and "0" bits are encoded as 011,101 tri-bit symbols respectively.

6. The method of claim 1 wherein Gray code "0" and "1" bits are encoded as 111,100 tri-bit symbols respectively.

7. The method of claim 1 wherein Gray code "0" and "1" bits are encoded as 111,001 tri-bit symbols respectively.

8. The method of claim 1 wherein Gray code "0" and "1" bits are encoded as 110,101 tri-bit symbols respectively.

9. The method of claim 1 wherein Gray code "0" and "1" bits are encoded as 011,101 tri-bit symbols respectively.

* * * * *